United States Patent
Shokrollahi et al.

(10) Patent No.: US 7,293,222 B2
(45) Date of Patent: Nov. 6, 2007

(54) SYSTEMS AND PROCESSES FOR FAST ENCODING OF HAMMING CODES

(75) Inventors: M. Amin Shokrollahi, San Jose, CA (US); Soren Lassen, San Francisco, CA (US)

(73) Assignee: Digital Fountain, Inc., Fremont, CA (US)

(*) Notice: Subject to any disclaimer, the term of this patent is extended or adjusted under 35 U.S.C. 154(b) by 432 days.

(21) Appl. No.: 10/769,732

(22) Filed: Jan. 29, 2004

(65) Prior Publication Data
US 2005/0010847 A1    Jan. 13, 2005

Related U.S. Application Data

(60) Provisional application No. 60/443,477, filed on Jan. 29, 2003.

(51) Int. Cl.
H03M 13/11    (2006.01)
(52) U.S. Cl. .................................................. 714/777
(58) Field of Classification Search ................ 714/777
See application file for complete search history.

(56) References Cited

U.S. PATENT DOCUMENTS 3,701,019 A * 10/1972 Jackson ..................... 340/518
5,305,384 A    4/1994 Ashby et al.
5,499,253 A    3/1996 Lary

FOREIGN PATENT DOCUMENTS

WO    WO96/34463 A1    10/1996

OTHER PUBLICATIONS

Lin et al., "Error Control Coding Fundamentals and Applications", Prentice-Hall, Inc., 1983, pp. 95-96.*

* cited by examiner

Primary Examiner—Stephen M. Baker
(74) Attorney, Agent, or Firm—Philip H. Albert; Townsend and Townsend and Crew LLP (57) ABSTRACT

Decoding that uses an extended Hamming code in one of the primary stages of static encoding uses a calculation of the r+1 Hamming redundant symbols for k input symbols from which Hamming redundant symbols are calculated, where r satisfies $2^{r-1}-r \leq k < 2^r-r-1$. This efficient method requires on the order of 2k+3r+1 XORs of input symbols to calculate the r+1 Hamming redundant symbols.

17 Claims, 7 Drawing Sheets column index

|  | 0 | 1 | 2 | 3 |
|---|---|---|---|---|
| 0 | 0 | 0 | 1 | 1 |
| 1 | 0 | 1 | 0 | 1 |
| 2 | 0 | 1 | 1 | 0 |
| 3 | 0 | 1 | 1 | 1 |
| 4 | 1 | 0 | 0 | 1 |
| 5 | 1 | 0 | 1 | 0 |
| 6 | 1 | 0 | 1 | 1 | row index

SYSTEMS AND PROCESSES FOR FAST ENCODING OF HAMMING CODES

CROSS-REFERENCES TO RELATED APPLICATIONS

This application claims priority from co-pending U.S. Provisional Patent Application No. 60/443,477 filed Jan. 29, 2003 entitled "Fast Algorithm for Encoding the Extended Hamming Code" which is hereby incorporated by reference, as is set forth in full in this document, for all purposes.

BACKGROUND OF THE INVENTION

The present invention relates to systems and methods for decoding data, and more particularly, to systems and methods for decoding multi-stage information additive codes, herein referred to collectively as "Raptor Codes."

Chain reaction codes have been described previously in the assignee's patents, such as U.S. Pat. No. 6,307,487 entitled "Information Additive Code Generator and Decoder for Communication Systems" (hereinafter "Luby I"), and U.S. Pat. No. 7,068,729 entitled "Multi-Stage Code Generator and Decoder for Communication Systems" (hereinafter "Raptor"). As described therein, chain reaction coding is a form of forward error-correction that enables data reconstruction from a received data set of a sufficient size, regardless of which portions of the transmitted data set are received. Communication systems employing chain reaction codes are able to communicate information much more efficiently compared to traditional FEC codes transmitted via data carousel or acknowledgement-based protocols, as described in Luby I or Raptor.

Transmission of data between a sender and a recipient over a communications channel has been the subject of much literature. Preferably, but not exclusively, a recipient desires to receive an exact copy of data transmitted over a channel by a sender with some level of certainty. Where the channel does not have perfect fidelity (which covers most of all physically realizable systems), one concern is how to deal with data lost or garbled in transmission. Lost data (erasures) are often easier to deal with than corrupted data (errors) because the recipient cannot always tell when corrupted data is data received in error. Many error-correcting codes have been developed to correct for erasures and/or for errors. Typically, the particular code used is chosen based on some information about the infidelities of the channel through which the data is being transmitted and the nature of the data being transmitted. For example, where the channel is known to have long periods of infidelity, a burst error code might be best suited for that application. Where only short, infrequent errors are expected, a simple parity code might be best.

Data transmission between multiple senders and/or multiple receivers over a communications channel has also been the subject of much literature. Typically, data transmission from multiple senders requires coordination among the multiple senders to allow the senders to minimize duplication of efforts. In a typical multiple sender system sending data to a receiver, if the senders do not coordinate which data they will transmit and when, but instead just send segments of the file, it is likely that a receiver will receive many useless duplicate segments. Similarly, where different receivers join a transmission from a sender at different points in time, a concern is how to ensure that all data the receivers receive from the sender is useful. For example, suppose the sender is wishes to transmit a file, and is continuously transmitting data about the same file. If the sender just sends segments of the original file and some segments are lost, it is likely that a receiver will receive many useless duplicate segments before receiving one copy of each segment in the file. Similarly, if a segment is received in error multiple times, then the amount of information conveyed to the receiver is much less than the cumulative information of the received garbled data. Often this leads to undesirable inefficiencies of the transmission system.

Often data to be transmitted over a communications channel is partitioned into equal size input symbols. The "size" of an input symbol can be measured in bits, whether or not the input symbol is actually broken into a bit stream, where an input symbol has a size of M bits when the input symbol is selected from an alphabet of $2^M$ symbols.

A coding system may produce output symbols from the input symbols. Output symbols are elements from an output symbol alphabet. The output symbol alphabet may or may not have the same characteristics as the alphabet for the input symbols. Once the output symbols are created, they are transmitted to the receivers.

The task of transmission may include post-processing of the output symbols so as to produce symbols suitable for the particular type of transmission. For example, where transmission constitutes sending the data from a wireless provider to a wireless receiver, several output symbols may be lumped together to form a frame, and each frame may be converted into a wave signal in which the amplitude or the phase is related to the frame. The operation of converting a frame into a wave is often called modulation, and the modulation is further referred to as phase or amplitude modulation depending on whether the information of the wave signal is stored in its phase or in its amplitude. Nowadays this type of modulated transmission is used in many applications, such as satellite transmission, cable modems, Digital Subscriber Lines (DSL), and many others.

A transmission is called reliable if it allows the intended recipient to recover an exact copy of the original data even in the face of errors and/or erasures during the transmission. Recovery of erased information has been the subject of much literature and very efficient coding methods have been devised in this case. Chain reaction codes, as described in Luby I or Raptor, are among the most efficient coding methods known to date for recovery of erasures in a wide variety of settings.

One solution that has been proposed to increase reliability of transmission is to use Forward Error-Correction (FEC) codes, such as Reed-Solomon codes, Tornado codes, or Low Density Parity Check (LDPC) codes. With such codes, one sends output symbols generated from the content instead of just sending the input symbols that constitute the content. Traditional error correcting codes, such as Reed-Solomon or other LDPC codes, generate a fixed number of output symbols for a fixed length content. For example, for K input symbols, N output symbols might be generated. These N output symbols may comprise the K original input symbols and N-K redundant symbols. If storage permits, then the sender can compute the set of output symbols for each piece of data only once and transmit the output symbols using a carousel protocol.

One problem with some FEC codes is that they require excessive computer power or memory to implement. Another problem is that the number of output symbols must be determined in advance of the coding process. This can lead to inefficiencies if the error rate of the symbols is overestimated, and can lead to failure if the error rate is underestimated. Moreover, traditional FEC schemes often require a mechanism to estimate the reliability of the communications channel on which they operate. For example, in wireless transmission the sender and the receiver are in need of probing the communications channel so as to obtain an estimate of the noise and hence of the reliability of the channel. In such a case, this probing has to be repeated quite often, since the actual noise is a moving target due to rapid and transient changes in the quality of the communications channel.

For traditional FEC codes, the number of valid output symbols that can be generated is of the same order of magnitude as the number of input symbols the content is partitioned into and is often a fixed ratio called the "code rate." Typically, but not exclusively, most or all of these output symbols are generated in a preprocessing step before the sending step. These output symbols have the property that all the input symbols can be regenerated from any subset of the output symbols equal in length to the original content or slightly longer in length than the original content.

Chain reaction decoding described in Luby I and Raptor is a different form of forward error-correction that addresses the above issues in cases where a transmission error constitutes an erasure. For chain reaction codes, the pool of possible output symbols that can be generated is orders of magnitude larger than the number of the input symbols, and a random output symbol from the pool of possibilities can be generated very quickly. For chain reaction codes, the output symbols can be generated on the fly on an as needed basis concurrent with the sending step. Chain reaction codes have the property that all input symbols of the content can be regenerated from any subset of a set of randomly generated output symbols slightly longer in length than the original content.

Other descriptions of various chain reaction coding systems can be found in documents such as U.S. Pat. No. 6,486,803, entitled "On Demand Encoding with a Window" and U.S. Pat. No. 6,411,223 entitled "Generating High Weight Output symbols using a Basis," assigned to the assignee of the present application.

Some embodiments of a chain reaction coding system comprise an encoder and a decoder. Data may be presented to the encoder in the form of a block, or a stream, and the encoder may generate output symbols from the block or the stream on the fly. In some embodiments, for example those described in Raptor, data may be pre-encoded off-line, or concurrently with the process of transmission, using a static encoder, and the output symbols may be generated from the static input symbols, defined as the plurality of the original data symbols, and the output symbols of the static encoder. In general, the block or stream of symbols from which the dynamic output symbols are generated is referred to herein as "source symbols." Thus, in the case of the codes described in Raptor, the source symbols are the static input symbols, while for codes described in Luby I the source symbols are the input symbols. The term "input symbols" herein refers to the original symbols presented to the encoder for encoding. Thus, for chain reaction codes described in Luby I, the source symbols are identical with input symbols. Sometimes, to distinguish between a Raptor Code, as for example one of the codes described in Raptor, and the codes described in Luby I, we will refer to the output symbols generated by a coding system employing a Raptor Code as the "dynamic output symbols."

In certain applications, it may be preferable to transmit the source symbols first, and then continue transmission by sending output symbols. Such a coding system is called a systematic coding system and systematic coding systems for codes such as those described in Luby I and Raptor are disclosed in U.S. Pat. No. 6,909,383 entitled "Systematic Encoding and Decoding of Chain Reaction Codes" (hereinafter "Systematic Raptor").

Various methods for generating source symbols from the input symbols are described in Raptor. Generally, but not exclusively, the source symbols are preferably generated efficiently on a data processing device, and, at the same time, a good erasure correcting capability is required of the multi-stage code. One of the teachings in Raptor is to use a combination of codes to produce the source symbols. In one particular embodiment, this combination comprises using a Hamming encoder to produce a first plurality of source symbols and then using an LDPC code to produce a second set of source symbols from which the dynamic output symbols are calculated.

Other methods and processes for both the generation of source symbols and dynamic output symbols have been discussed in U.S. Pat. No. 6,856,263 entitled "Systems and Processes for Decoding a Chain Reaction Code Through Inactivation" (hereinafter "Inactivation Decoding"). One advantage of a decoder according to Inactivation Decoding over a multi-stage chain reaction decoder described in Raptor is that the Inactivation Decoding decoder has typically a lower probability of error.

The encoding for a Raptor encoder in some embodiments can be partitioned into two stages. The first stage computes redundant symbols from the original input symbols, and the second stage generates output symbols from the combination of the original input symbols and redundant symbols. In some embodiments of a Raptor encoder, the first stage can be further partitioned into two or more steps, where some of these steps compute redundant symbols based on Low Density Parity Check (LDPC) codes or other codes, and where other steps compute redundant symbols based on other codes. To lower the probability of error of the decoder, both multi-stage chain reaction decoding and some embodiments of decoding described in Inactivation Decoding make use of an extended Hamming code in these other steps, and thus an extended Hamming code is used in these embodiments in one of the primary stages of static encoding.

As is well known to those skilled in the art, a Hamming code generates, for a given number k of input symbols, a number k+r+1 of source symbols, wherein the first k source symbols coincide with the input symbols, and the additional r+1 source symbols (referred to as the "Hamming redundant symbols" hereinafter) are calculated. The number r is the smallest integer with the property illustrated in Equation 1.

$$2^{r-1}-r \leq k < 2^r-r-1 \qquad \text{(Equ. 1)}$$

The Hamming redundant symbols are calculated in a specific way from the input symbols. Using the naïve method for the computation of these symbols, each Hamming redundant symbol requires on average around k/2 XORs of input symbols. In total, the calculation of the r+1 Hamming redundant symbols requires around (k/2)·r XORs of input symbols. Since r is of the order log(k), this amounts to roughly k·log(k)/2 XORs of input symbols for the calculation of the Hamming redundant symbols. Taking into account that the additional redundant symbols calculated via, for example LDPC encoding, require much less computational time, the calculation of the Hamming redundant symbols using the naïve approach would constitute a computational bottleneck for the design of some embodiments of reliable multi-stage encoders.

What is therefore needed is an apparatus or process for calculating the Hamming redundant symbols that is much more efficient than the naïve one, and can be implemented easily on various computing devices.

BRIEF SUMMARY OF THE INVENTION

Decoding that uses an extended Hamming code in one of the primary stages of static encoding uses a calculation of the r+1 Hamming redundant symbols for k input symbols from which Hamming redundant symbols are calculated, where r satisfies $2^{r-1}-r \leq k < 2^r-r-1$. This efficient method requires on the order of 2k+3r+1 XORs of input symbols to calculate the r+1 Hamming redundant symbols.

DETAILED DESCRIPTION OF THE INVENTION

The Extended Hamming Code

Figure 1:
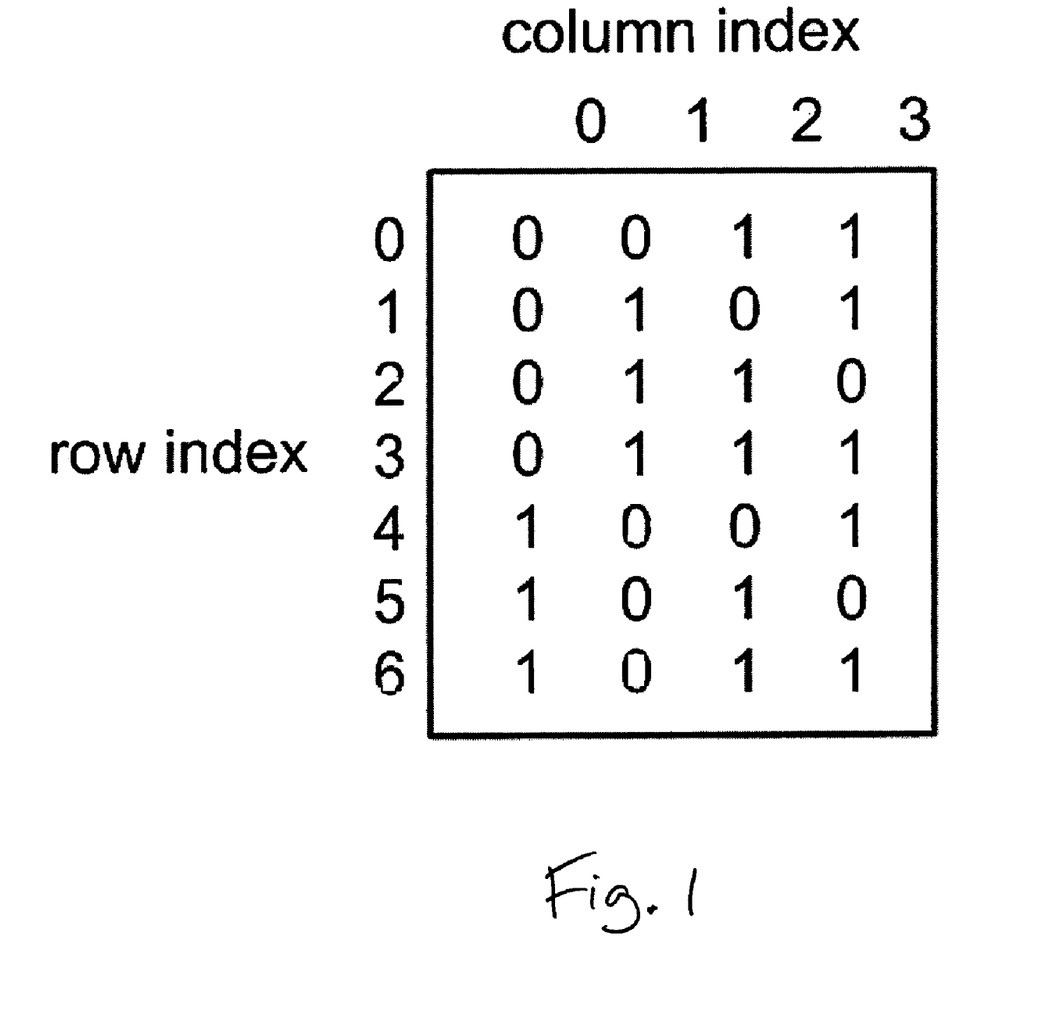
FIG. 1 is an illustration of an example of a Hamming matrix H.

An extended Hamming code computes for a sequence of k input symbols a plurality of r+1 Hamming redundant symbols. Each of these Hamming redundant symbols is the XOR of some of the input symbols, where generally the lengths of all the symbols are the same. We use matrix notation to describe exactly which input symbols are XORed to yield a given Hamming redundant symbol. Let $(x_0, x_1, \ldots, x_{k-1})$ denote the sequence of k input symbols, and let $(y_0, y_1, \ldots, y_r)$ denote the sequence of Hamming redundant symbols, where r satisfies Equation 1. The relationship between the input symbols and the first r Hamming redundant symbols can be represented as shown in FIG. 1 by a matrix H with k rows and r columns with each entry being 0 or 1 such that the Hamming redundant symbols can be calculated from the input symbols using Equation 2.

$$(x_0, x_1, \ldots, x_{k-1}) \cdot H = (y_0, y_1, \ldots, y_{r-1}) \quad \text{(Equ. 2)}$$

The r+1 Hamming redundant symbol is $y_r = x_0 \oplus x_1 \oplus \ldots \oplus x_{k-1} \oplus y_0 \oplus y_1 \oplus \ldots \oplus y_{r-1}$. Herein, the symbol "$\oplus$" denotes the XOR operation.

The matrix H has a special form that can be described as follows. The binary representation of length, s, of an integer n is the sequence $(n_s, n_{s-1}, \ldots, n_0)$, denoted by $(n)_s$ such that Equation 3 is satisfied.

$$n = n_s \cdot 2^s + n_{s-1} \cdot 2^{s-1} + \ldots + n_1 \cdot 2 + n_0 \quad \text{(Equ. 3)}$$

The matrix H is the matrix in which the rows are equal to $(n)_r$, where n runs over the first k positive integers that are not powers of the integer 2. For example, when k=7 and r=4, the corresponding matrix H would be as shown in FIG. 1. In this example, the seven rows of the matrix are indexed 0 through 6 and the entries in the rows correspond to the binary representations of the integers 3, 5, 6, 7, 9, 10, and 11 (noting that 1, 2, 4, and 8 are all powers of 2 and thus are omitted from the sequence).

Naïve Method for Evaluating Hamming Redundant Symbols

In a naïve calculation of the product in Equ. 2, the number of XORs of input symbols performed for calculating each Hamming redundant symbol $y_i$ for i=0, 1, . . . , r−1 is one less than the number of ones in the column corresponding to i in the matrix H. Since H has roughly k·r/2 ones, the number of XORs of input symbols performed by the naïve method is of the order of k·log(k).

An Embodiment of an Efficient Method for Evaluating Hamming Redundant Symbols

We present a method by which the Hamming redundant symbols can be calculated on average with at most 2k+3r+1 XORs of input symbols.

Figure 2:
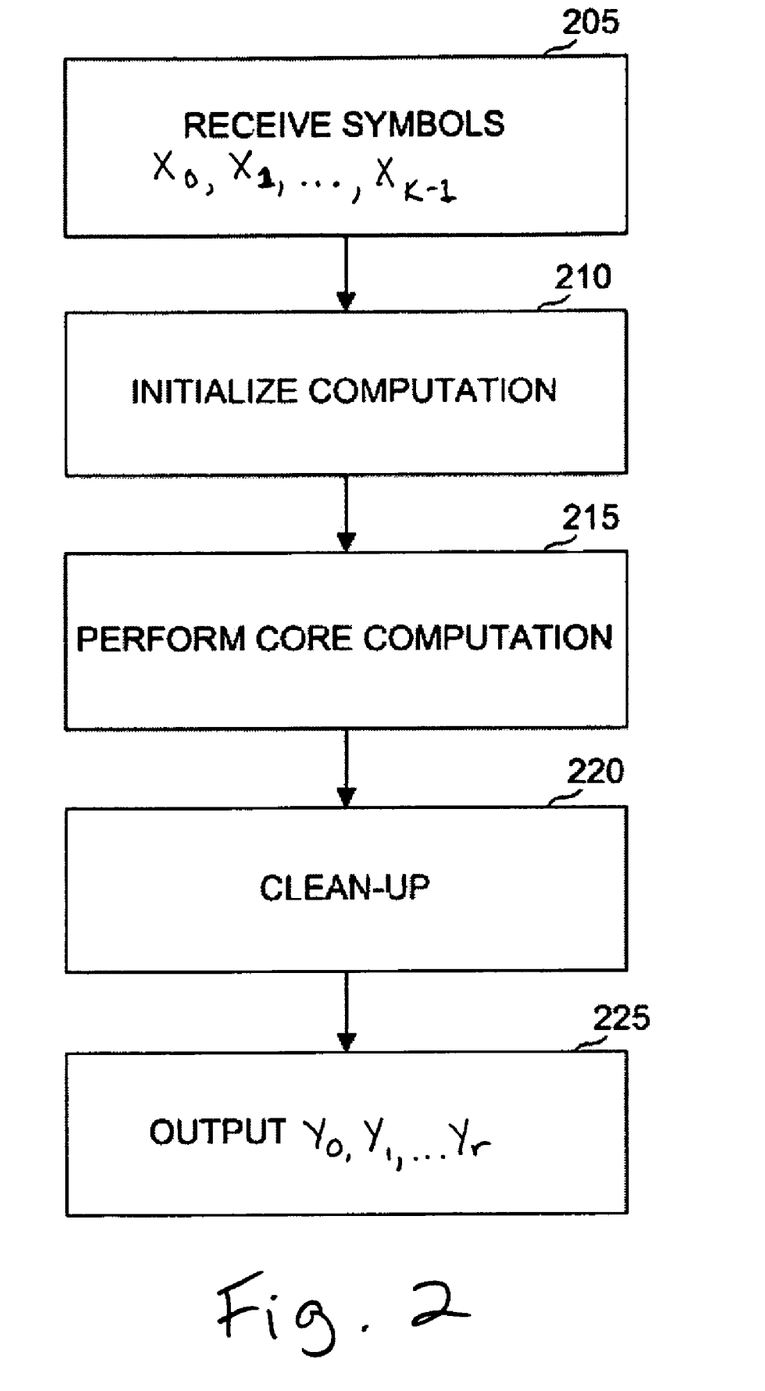
FIG. 2 is a flowchart of an overall method for encoding an efficient extended Hamming code according to embodiments of the present invention.

An exemplary embodiment of an efficient method for calculation of Hamming redundant symbols is shown in FIG. 2. The method comprises three phases: an Initialize Computation phase shown in step 210, a Perform Core Computation phase shown in step 215, and a Clean Up phase shown in step 220. The method starts by receiving the input symbols $x_0, x_1, \ldots, x_{k-1}$ in 205, performs the phases shown in steps 210, 215, and 220 on the input symbols, and outputs the Hamming redundant symbols $y_0, y_1, \ldots, y_r$ in step 225.

Figure 3:
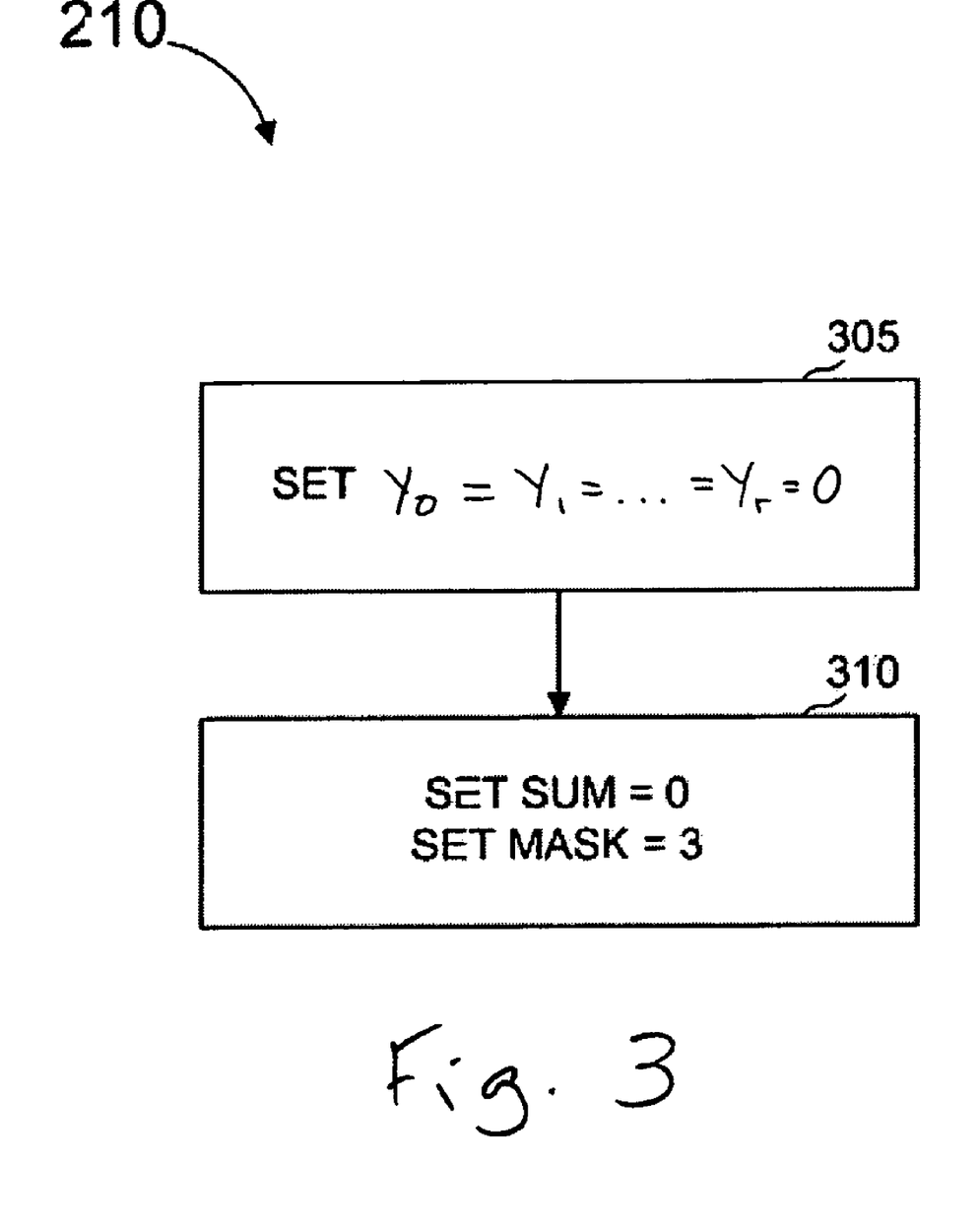
FIG. 3 is a flowchart of a method for implementing the Initialize Computation phase of FIG. 2.

An exemplary embodiment of the Initialize Computation phase 210 of FIG. 2 is shown in FIG. 3. The Initialize Computation phase 210 shown in FIG. 3 comprises two major steps. Step 305 initializes the values of each of the Hamming redundant symbols to zero. The second step 310 initializes the values of two variables: SUM is initialized to 0 and MASK is initialized to 3, the smallest integer greater than zero that is not a power of 2. During the Perform Core Computation phase 215 of FIG. 2, the value of SUM will be the XOR of all the input symbols visited during the execution of the process.

Figure 4A:
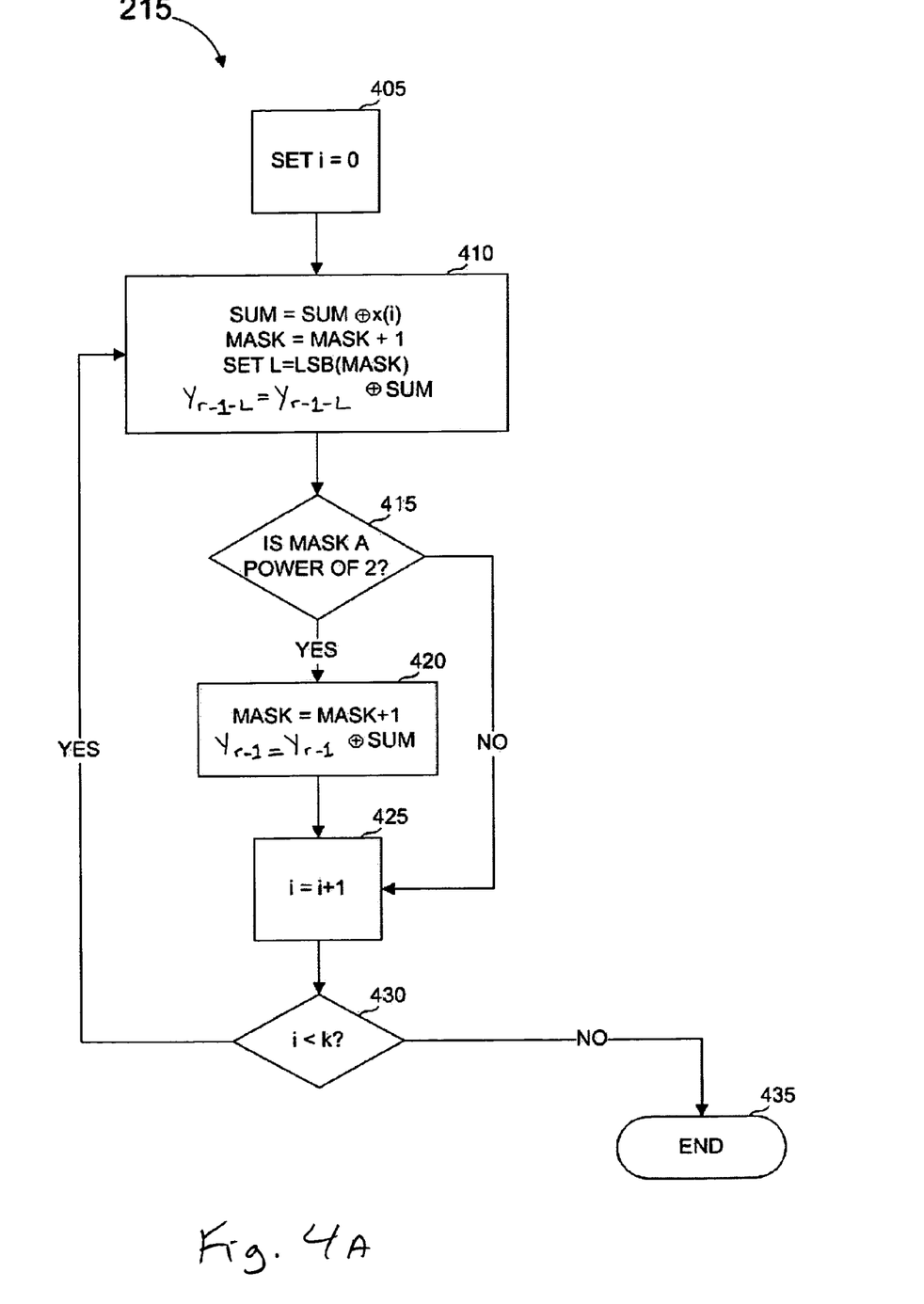
FIG. 4(a) is a flowchart of a method for implementing the Perform Core Computation phase of FIG. 2.

FIG. 4(a) shows one exemplary embodiment of the Perform Core Computation phase 215 of FIG. 2. The overall structure of this phase is a loop over all the input symbols $x_0, x_1, \ldots, x_{k-1}$. A variable i keeps track of the indices of these symbols, and is, accordingly, initialized to zero in 405 of course, other indexing methods can be used instead. In step 410, the variables SUM and MASK are updated. The value $y_{r-L-1}$ is updated as well, wherein L is the position of the least significant bit of MASK expressed in binary. This function is denoted by LSB.

The function LSB can be calculated in a variety of ways, as is well known to those of skill in the art. On some central processing units, this function may be exposed to the user, and could potentially be used using assembly languages for those computer processing units. In other embodiments, this function may be calculated in software. For example, where MASK is odd, the value of L is equal to 0, whereas if, for example, MASK is 12, then the value of L is 2. In general, $2^L$ is the largest power of 2 by which MASK is divisible. A lookup table might be used to hold pre-computed values.

The updates ensure that SUM remains the XOR of the values of all of the $x_i$ visited so far. In step 410, the value of MASK is incremented by one, and the value L is set to be the position of the least significant bit of MASK. The value of $y_{r-L-1}$ is updated by XORing it with the value of SUM.

Step 415 tests whether MASK is a power of 2. If so, then the process continues in step 420 by incrementing the counter MASK, and updating the value of $y_{r-1}$ by XORing it with the current value of SUM. If the test in step 415 is not satisfied, i.e., if MASK is not a power of 2, then the counter i is incremented in step 425, and steps 410 through 425 are repeated if the new value of i is smaller than k (step 430). If the new value of i is larger than or equal to k, then the loop terminates (step 435), and the process continues with the clean-up phase 220 of FIG. 2.

Figure 4B:
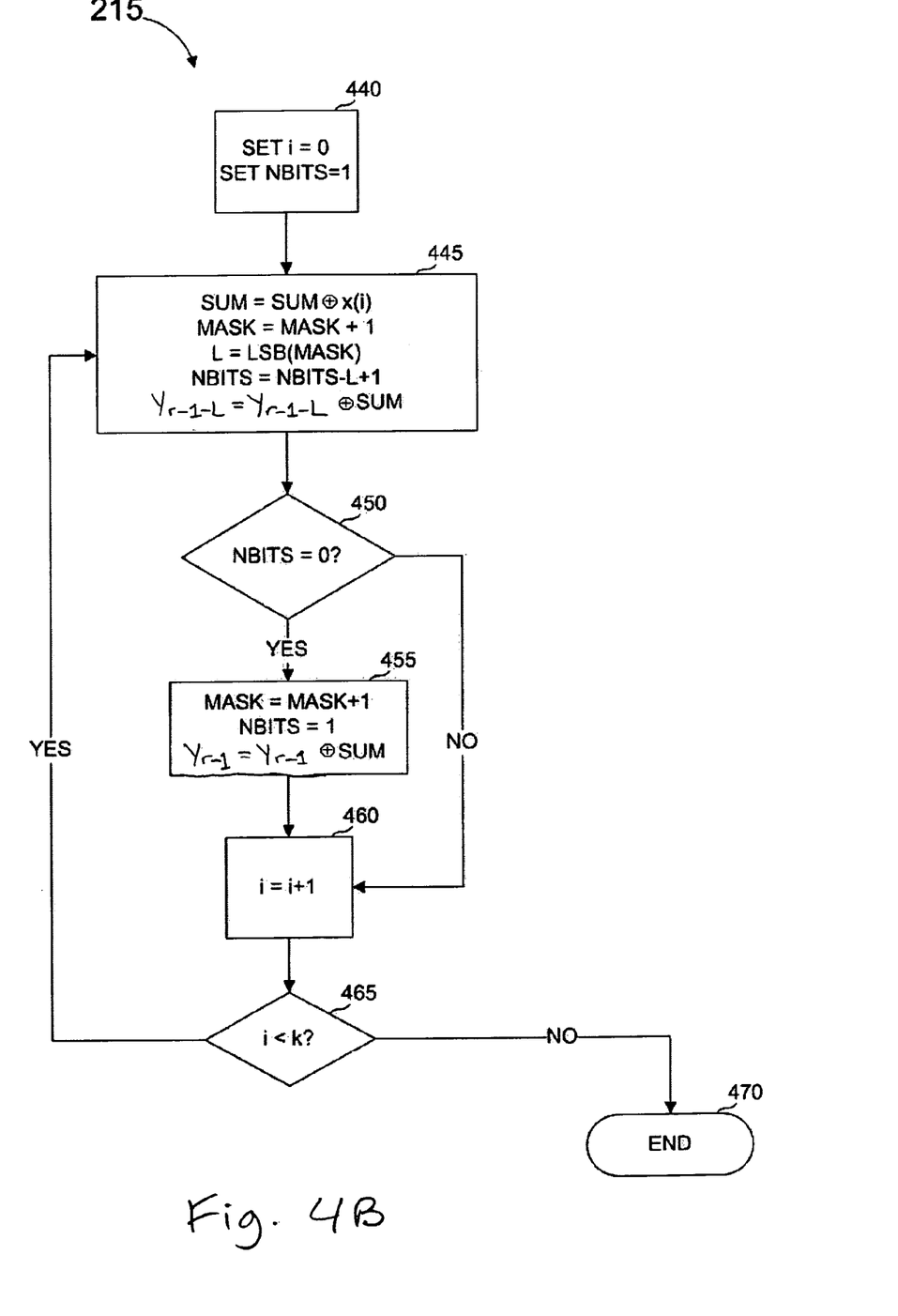
FIG. 4(b) is a flowchart of a method for implementing the Perform Core Computation phase of FIG. 2 where NBITS is used to determine if MASK is a power of two.

Testing whether MASK is a power of the integer 2 in step 415 of FIG. 4(a) can be done in a variety of ways. FIG. 4(b) is an alternative embodiment of the Core Computation Phase with an efficient implementation of this test. The steps in this alternative embodiment are similar to those described in FIG. 4(a). One difference between these embodiments is the variable NBITS, which is initialized to 1 in step 440, and updated in step 445 to obtain the new value NBITS-L+1, wherein, as before, L is the least significant bit of the integer MASK.

With this notation, the test in step 415 of FIG. 4(a) can be replaced by the test in step 450 of FIG. 4(b), i.e., by the test of whether NBITS is zero. It should be clear to those of skill in the art that the variable MASK is a power of 2 only if the variable NBITS introduced and updated as described assumes the value 0. In this case, the update in step 455 of FIG. 4(b) includes an update of the variable NBITS to the value 1. As is appreciated by those of skill in the art, this method is a very efficient one for testing whether or not the value MASK is a power of 2.

Figure 4C:
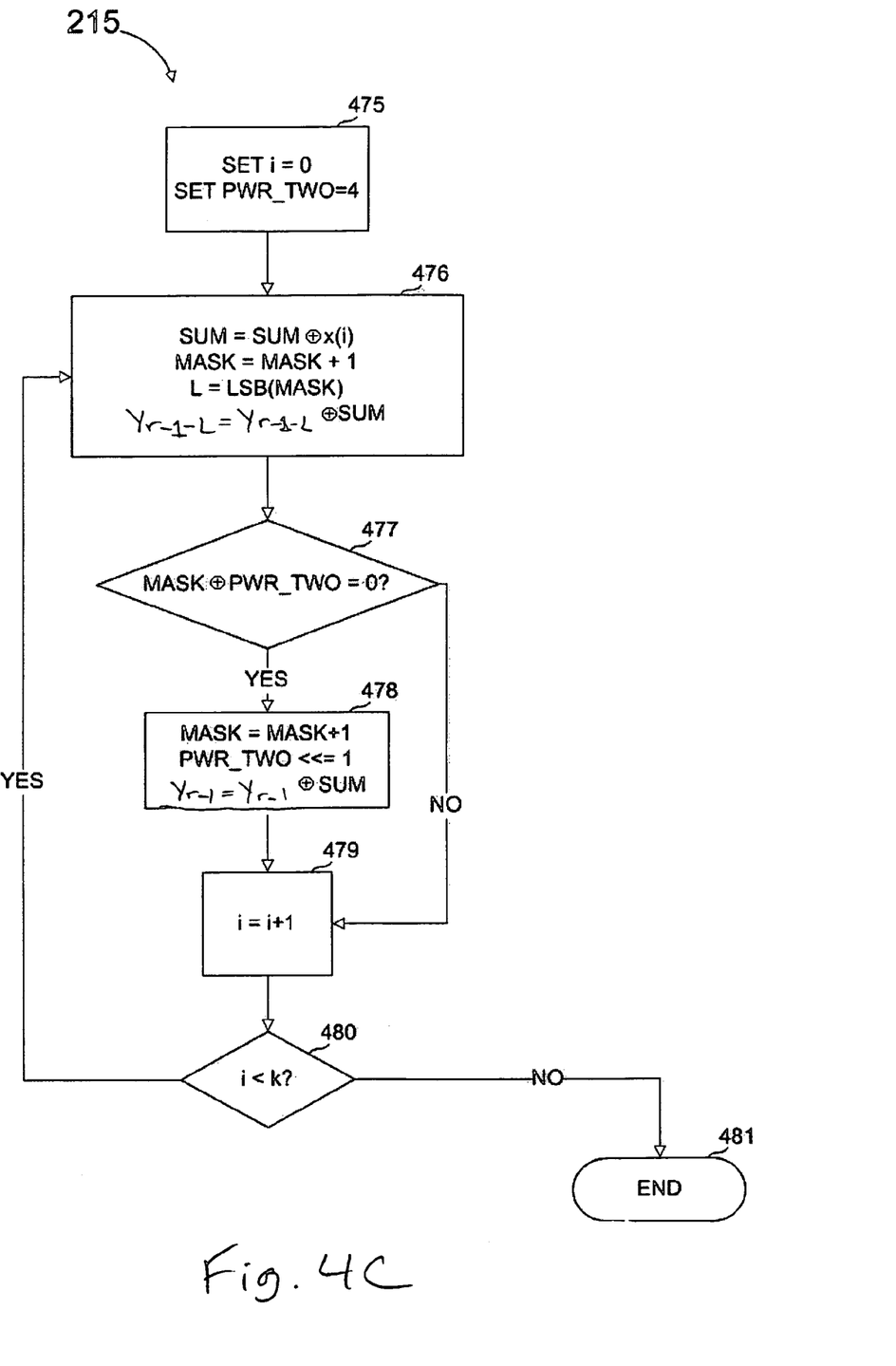
FIG. 4(c) is a flowchart of a method for implementing the Perform Core Computation phase of FIG. 2 where a different method is used to determine if MASK is a power of two.

Yet another embodiment of the Perform Core Computation phase is exemplified in FIG. 4(c). This embodiment makes use of a variable PWR_TWO initialized in step 475 to the value 4. The number 4 is chosen because it is the smallest power of 2 larger than 2. The test in step 477 performs the computation MASK⊕PWR_TWO. If this value is 0, then MASK is a power of 2, and step 478 is performed. In addition to the updates common to step 420 of FIG. 4(a), this step updates the value of PWR_TWO by shifting PWR_TWO left by one bit, i.e., by doubling its value.

Figure 5:
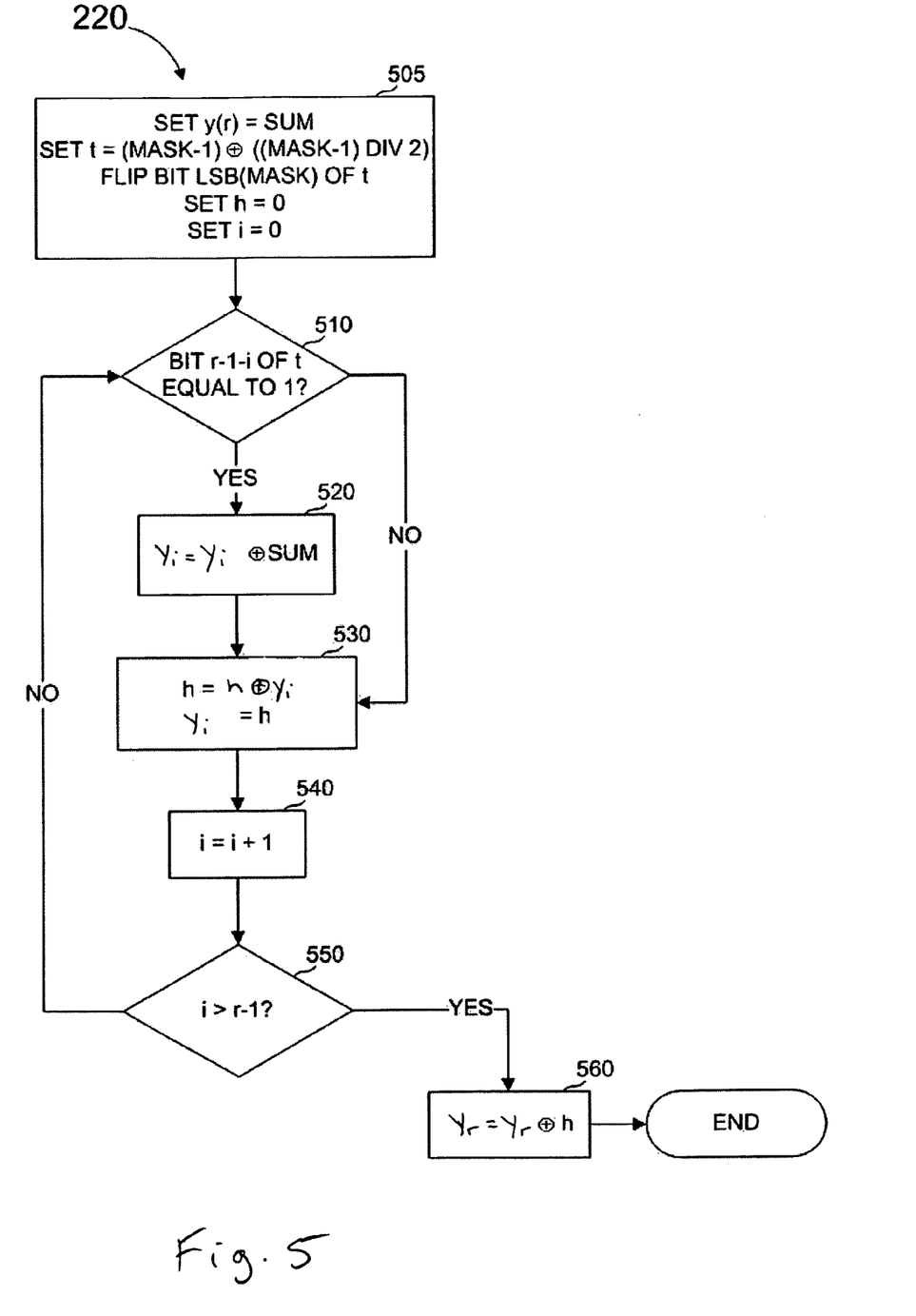
FIG. 5 is a flowchart of a method for implementing the Clean Up phase of FIG. 2.

An exemplary embodiment of the Clean Up phase 220 is shown in FIG. 5. This phase comprises an initialization step 505 and a computation that loops through values of a variable i ranging from 0 to r−1. The computation loop encompasses steps 510 through 550 in FIG. 5. In the initialization step 505, the value of $y_r$ is set to be equal to SUM, and two new variables, called t and h, are initialized. The value of t is set to be equal to the XOR of the integer MASK−−1 and the integer obtained as the largest integer less than or equal to (MASK−−1)/2. In FIG. 5, the latter integer is denoted by (MASK−−1) DIV 2, where the operation DIV 2 divides the value of MASK−−1 by two and discards the remainder so that the result is an integer. Moreover, the bit corresponding to LSB(MASK) is flipped.

It should be noted that the value of LSB(MASK) need not be computed in this step, as it has already been calculated in step 410 of FIG. 4. The value of h is set to zero; during the subsequent loop, the value of h will always be equal to the XOR of all the Hamming redundant symbols visited so far. Also in step 505, the value of the counter i is initialized to 0. This initialization is done in preparation for the computation loop steps 510 through 550.

In step 510 of the computation loop, it is checked whether bit r−i−1 of the integer t is equal to 1, and if the test is true, then the next step is 520. In step 520, the value of $y_i$ is updated by XORing it with the value of SUM, and the process continues with step 530.

If the result of the test in step 510 is false, then the process jumps directly to step 530. In step 530, the value of h and the value of $y_i$ are both updated: h is set to the XOR of its value with $y_i$ and the value of $y_i$ is set equal to h. Steps 540 and 550 ensure that the loop on the variable i is performed, with the value of i incremented at each step, until i is equal to r, in which case the loop terminates and the last step of the clean-up process is performed in step 560. In this step the value of $y_r$ is calculated by XORing its current value with h.

An exemplary implementation of this method using the alternative embodiment of the Perform Core Computation phase in FIG. 4(b) is provided in the appendix. This particular implementation uses the MAPLE™ system, created by Maplesoft, a division of Waterloo Maple Inc., that provides high-level commands suitable for a structured description of the method described here. The particular implementation here is only to serve a better understanding of the details of this application, and is not intended to be restrictive.

One skilled in the art will recognize that there are other alternative methods to those shown in FIGS. 2, 3, 4(a), 4(b), 4(c) and 5 for efficient computation of the Hamming redundant symbols. For example, one could set k'=k+r and then set $x'_{i'}=x_i$ where i' ranges from 0 to k'−1 but omits the values of i' that are powers of two, while i ranges from 0 to k−1. Then, $x'_{i'}$ is set to 0 for values of i' that are powers of two. Then, one could calculate the Hamming redundant symbols $y_0, y_1, \ldots, y_r$ based on $x'_0, x'_1, \ldots, x'_{k'-1}$, thereby avoiding the special logic shown in FIGS. 4 and 5 that deal with the case when MASK is a power of two, at the expense of computing $x'_0, x'_1, \ldots, x'_{k'-1}$ from $x_0, x_1, \ldots, x_{k-1}$ as just described.

As another example of an alternative of the method described in FIGS. 2, 3, 4(a) and 5, one could replace step 205 of FIG. 4(a) with a method whereby the subsequent steps of computing $y_0, y_1, \ldots, y_r$ are interleaved with the arrival of $x_0, x_1, \ldots, x_{k-1}$.

As an example of the method shown in FIG. 2 for the efficient computation of the Hamming redundant symbols we describe some of the intermediate results for the case k=12. In this case, r=5, and the Hamming redundant symbols $y_0, y_1, y_2, y_3, y_4, y_5$ equal the following values after the Perform Core Computation phase 215 of FIG. 2:

$$y_0 = x_0 \oplus x_1 \oplus x_2 \oplus x_3 \oplus x_4 \oplus x_5 \oplus x_6 \oplus x_7 \oplus x_8 \oplus x_9 \oplus x_{10} \quad \text{(Equ. 4a)}$$

$$y_1 = x_0 \oplus x_1 \oplus x_2 \oplus x_3 \quad \text{(Equ. 4b)}$$

$$y_2 = x_1 \oplus x_2 \oplus x_3 \oplus x_4 \oplus x_5 \oplus x_6 \quad \text{(Equ. 4c)}$$

$$y_3 = x_2 \oplus x_3 \oplus x_4 \oplus x_9 \oplus x_{10} \oplus x_{11} \quad \text{(Equ. 4d)}$$

$$y_4 = x_0 \oplus x_3 \oplus x_6 \oplus x_7 \oplus x_{10} \quad \text{(Equ. 4e)}$$

$$y_5 = 0 \quad \text{(Equ. 4f)}$$

The value of MASK at this point equals 18. The value of t after step 505 in FIG. 5 equals 27. At the end of the clean-up phase, the values of $y_0, y_1, y_2, y_3, y_4, y_5$ equal the following:

$$y_0 = x_{11} \quad \text{(Equ. 4a)}$$

$$y_1 = x_4 \oplus x_5 \oplus x_6 \oplus x_7 \oplus x_8 \oplus x_9 \oplus x_{10} \quad \text{(Equ. 4b)}$$

$$y_2 = x_1 \oplus x_2 \oplus x_3 \oplus x_7 \oplus x_8 \oplus x_9 \oplus x_{10} \quad \text{(Equ. 4c)}$$

$$y_3 = x_0 \oplus x_2 \oplus x_3 \oplus x_5 \oplus x_6 \oplus x_9 \oplus x_{10} \quad \text{(Equ. 4d)}$$

$$y_4 = x_0 \oplus x_1 \oplus x_3 \oplus x_4 \oplus x_6 \oplus x_8 \oplus x_{10} \oplus x_{11} \quad \text{(Equ. 4e)}$$

$$y_5 = x_2 \oplus x_5 \oplus x_7 \oplus x_9 \quad \text{(Equ. 4f)}$$

Calculating Several Sets of Hamming Redundant Symbols

As was mentioned above, one of the reasons for using the extended Hamming code is the excellent erasure correction capability of this code. In certain applications, however, it is important to protect the data with more redundant symbols than an extended Hamming code is capable of producing. This is particularly important when the redundant symbols are used to decrease the error in a probabilistic decoding algorithm, such as those described in Raptor. For this reason, a variation of using Hamming codes is described herein that is capable of producing several sets of redundant symbols, wherein each set of redundant symbols has the same number of redundant symbols as the Hamming code. This encoder is referred to as the "parallel Hamming encoder" herein.

Denoting again by k the number of input symbols to the parallel Hamming encoder, and by s the number of sets of independent Hamming redundant symbols that are to be generated, the method starts by calculating s random or pseudorandom permutations of the integers $0, 1, \ldots, k-1$. There are a number of ways to calculate these permutations, as is well known to those of skill in the art.

In some embodiments, one property of these permutations is that they are easy to calculate, i.e., it is easy to determine for any given j in among the integers $0, 1, \ldots k-1$, what the image of j under the permutation is. For example, where k is a prime number, one of the many possibilities for this permutation can be to independently choose two random integers a and b, where a is chosen uniformly at random in the range $1, 2, \ldots, k-1$, and b is independently chosen at random in the range $0, 1, \ldots, k-1$. Then, the image of j under the permutation defined by a and b is defined as $a \cdot j + b$ modulo the integer k. In other words, this image is the remainder of the division of $a \cdot j + b$ by k.

If k is not a prime number, then the numbers a and b can be chosen by choosing a uniformly at random from the set of positive integers less than k which do not have a common divisor with k, while b can be chosen uniformly at random in the range $0, 1, \ldots, k-1$ as before. Various other methods for generating permutations can be envisioned by those of skill in the art upon studying this application, and the method described below does not depend on the specific choice of the permutations, except that in preferred applications it is desirable to have s different permutations.

Returning to the description of the parallel Hamming encoder, the encoder generates s random or pseudorandom permutations, denoted $\pi_1, \pi_2, \pi_s$. There will be s sets of redundant Hamming symbols denoted $y_{00}, y_{01}, \ldots, y_{0r}; y_{10}, y_{11}, \ldots, y_{1r}; \ldots; y_{s-1,0}, y_{s-1,1}, \ldots, y_{s-1,r}$. As before, r is the smallest positive integer such that $2^{r-1} - r \leq k < 2^r - r - 1$. The generation of the redundant symbols of the parallel Hamming encoder is done one set at a time.

To generate the jth set, where $j=0, 1, \ldots, s-1$, the encoder proceeds in a similar manner as the original Hamming encoder described above. The encoder might comprise three phases, similar to those shown in FIG. 2, with a modification for parallel operation of step 410, when updating the value of SUM. In the parallel encoder, the value of SUM is updated as $\text{SUM}=\text{SUM} \oplus x(\pi_j(i))$.

Using the Fast Encoder for Recovering from Erasures

A Raptor decoder might be used to recover the original input symbols from the received dynamic symbols. If an extended Hamming code is used by the encoder, one of the steps in the decoding process in some embodiments is to recover some of the symbols involved in an extended Hamming code based on the recovery of the remainder of the symbols involved in the extended Hamming code. The extended Hamming code has the property that with high probability any combination of $r' \leq r+1$ missing symbols can be recovered if the remaining symbols among the $k+r+1$ symbols $y_0, y_1, y_r$, and $x_0, x_1, \ldots, x_{k-}1$ have already been recovered.

The relationship between a missing set of r' symbols $z_0, z_1, \ldots, z_{r'}$ can be efficiently calculated using at most $2k+3r+1$ XORs of symbols given the values of the remaining $k'=k+r+1-r'$ symbols $w_0, w_1, \ldots, w_{k'}$, using a variant of the efficient method for calculating the extended Hamming code disclosed above. This can dramatically speed up the overall decoding time, since this avoids using $k \cdot \log(k)$ XORs of symbols to calculate the relationships between the r' missing symbols based on a variant of the naïve method of calculating the extended Hamming code.

Appendix A

Implementation of the Fast Computation of Hamming Redundant Symbols in Using the Programming Language Provided by the MAPLE™ System

```
LSB := proc( n )
   local i:
   i := 0:
   while ( n mod 2^i = 0 ) do i := i+1: od:
   return i-1:
end proc:
XOR := proc( a, b)
   local c:
   c := a+b:
   c := c mod 2:
   return c;
end proc:
findr := proc( k )
   local r:
   r := 0:
   while ( 2^r-r-1 < k ) do r := r+1 : od:
   return r;
end proc:
binary := proc( n, l )
   local i, v, j:
   v := [seq( 0, i=1..l)]:
   j := n:
   for i from 1 to l do v[l-i+1] := j mod 2: j := (j-(j mod 2))/2: od:
   return v;
end proc:
myxor := proc( m, n, l )
   local v1, v2, i, j:
   v1 := binary(m,l): v2 := binary(n,l):
   return [ seq(  (v1[i] + v2[i]) mod 2, i=1..l)];
end proc:
hamming := proc( k )
   local r, s, mask, t, tt, l, nbits, y, x, i, j:
   r := findr(k):
   s := 0: mask := 3: nbits := 1:
   r := findr(k); for i from 0 to r do y[i] := 0: od:
   for i from 0 to k-1 do
      s := XOR( s, x[i] ):
      mask := mask+1:
      l := LSB( mask ):
      nbits := nbits -l +1:
      y[r-1-l] := XOR( y[r-1-l], s ):
      if ( nbits = 0 ) then
         mask := mask+1:
         nbits := l: y[r-1] := XOR( y[r-1], s ):
      fi:
   od:
   t := myxor( (mask-1), floor( (mask-1)/2), r):print(t, mask, LSB(mask));
   t[ r-LSB(mask) ] := ( t[r-LSB(mask)] + 1) mod 2:
   print( t );
```

-continued

```
tt := 0:
y[r] := s:
for j from 0 to r−1 do
    if ( t[j+1] = 1) then
        y[j] := XOR( y[j], s ):
    fi:
    tt := XOR( tt, y[j] ):
    y[j] := tt:
od:
y[r] := XOR( y[r], tt ):
return [ seq( y[i], i=0..r) ];
end proc:
```

What is claimed is:

1. In a Hamming encoder or decoder wherein a sequence of Hamming redundant symbols is needed, a method of generating the Hamming redundant symbols generated from a sequence of source symbols comprising:

initializing an array of registers, wherein the array contains a register for each of the redundant symbols to be generated, and wherein initializing includes setting values of the registers to predefined values;

stepping through each of the source symbols in the sequence of source symbols;

for each source symbol, choosing one register and updating a value of that register based on the value of the source symbol, such updating of the register being done independent of values of other of the registers and, for that source symbol, updating a value of a designated register as needed; and adjusting each Hamming redundant symbol to form a final value, wherein each Hamming redundant symbol is adjusted independent of values of the source symbols.

2. A method for generating Hamming redundant symbols in a Hamming encoder or Hamming decoder that uses the Hamming redundant symbols generated from a sequence of source symbols, the method comprising:

initializing an array of registers, wherein the array contains at least a register for each of the redundant symbols to be generated, and wherein initializing includes setting values of the registers to predefined values and having at least one of the registers in the array being a designated register;

stepping through each of the source symbols in the sequence of source symbols;

for each source symbol:

a) selecting one of the registers and updating a value of that selected register based on the value of the source symbol, such updating of the selected register being independent of values of other of the registers; and b) updating a value of the designated register if a designated register criteria is met; and modifying register values to arrive at final redundant symbol values, wherein register values are modified independent of values of source symbols from the sequence of source symbols.

3. The method of claim 2, wherein modifying register values comprises one register-specific modification process for each redundant symbol.

4. The method of claim 2, wherein selecting one of the registers comprises selecting the register according to its index based on the index of the source symbol using a pre-defined function.

5. The method of claim 2, wherein each source symbol is representable by a plurality of bits.

6. The method of claim 2, wherein each source symbol is representable by a single bit.

7. The method of claim 2, wherein the number of updating steps is equal to the number of source symbols in the sequence of source symbols.

8. The method of claim 2, wherein initializing the array of registers comprises loading each of the registers with a value of zero.

9. The method of claim 2, wherein step b) comprises:
XORing the value of the source symbol into a help register; and
XORing the value of the help register into the selected register selected in step a).

10. The method of claim 2, wherein step b) comprises:
reading the source symbol;
performing a predefined set of operations to obtain an intermediate value;
computing a predefined function of the value of the selected register and the intermediate value; and
replacing the value of the selected register with the obtained value of the predefined function.

11. The method of claim 10, wherein the predefined set of operations comprises updating the values of auxiliary registers using the source symbol read.

12. The method of claim 11, wherein the predefined function is an exclusive-OR (XOR) function, such that the computing step comprises determining an XOR of the value of the selected register and the intermediate value.

13. The method of claim 12, wherein the total number of XORs of source symbols performed in step b is no more than twice a limit value plus twice the number of redundant symbols plus one, wherein the limit value is the number of source symbols in the sequence.

14. The method of claim 2, wherein modifying a register value, as part of the modifying register values step, comprises replacing the value of that register with a predefined function of the value of that register and an intermediate value.

15. The method of claim 14, wherein the predefined function is an exclusive-OR (XOR) function.

16. The method of claim 14, wherein the intermediate value is obtained from an intermediate value derived during step a) and/or step b), and from the value of the register using a predefined function.

17. The method of claim 16, wherein the predefined function is an exclusive-OR (XOR) function.

* * * * *